US008801858B2

(12) United States Patent
Rathweg et al.

(10) Patent No.: US 8,801,858 B2
(45) Date of Patent: Aug. 12, 2014

(54) NON-WEAR SHUTTER APPARATUS FOR A VAPOR DEPOSITION APPARATUS

(75) Inventors: Christopher Rathweg, Louisville, CO (US); Edwin Jackson Little, Denver, CO (US)

(73) Assignee: First Solar, Inc., Tempe, AZ (US)

( * ) Notice: Subject to any disclaimer, the term of this patent is extended or adjusted under 35 U.S.C. 154(b) by 869 days.

(21) Appl. No.: 12/977,416

(22) Filed: Dec. 23, 2010

(65) Prior Publication Data

US 2012/0164776 A1     Jun. 28, 2012

(51) Int. Cl.
*C23C 16/00* (2006.01)

(52) U.S. Cl.
USPC .......................................... 118/733; 118/726

(58) Field of Classification Search
CPC ........ B65D 43/16; B65D 43/18; B65D 43/20; B65D 43/265; B65D 45/16; B65D 45/34
USPC ................................. 118/733, 726
See application file for complete search history.

(56) References Cited

U.S. PATENT DOCUMENTS

| 5,147,498 | A | 9/1992 | Nashimoto |
| 5,288,515 | A | 2/1994 | Nakamura et al. |
| 5,304,499 | A | 4/1994 | Bonnet et al. |
| 5,334,251 | A | 8/1994 | Nashimoto |
| 6,171,641 | B1 | 1/2001 | Okamoto et al. |
| 6,423,565 | B1 | 7/2002 | Barth et al. |
| 6,444,043 | B1 | 9/2002 | Gegenwart et al. |
| 2003/0075273 | A1* | 4/2003 | Kilpela et al. ........... 156/345.33 |
| 2007/0089676 | A1* | 4/2007 | Klemm .......................... 118/726 |
| 2008/0115729 | A1* | 5/2008 | Oda et al. ....................... 118/726 |
| 2009/0194165 | A1 | 8/2009 | Murphy et al. |

* cited by examiner

*Primary Examiner* — Keath Chen
(74) *Attorney, Agent, or Firm* — MacMillan, Sobanski & Todd, LLC

(57) ABSTRACT

An apparatus and associated method for vapor deposition of a sublimated source material as a thin film on a photovoltaic (PV) module substrate includes a deposition head wherein a source material is sublimated. A distribution manifold is provided with a plurality of passages defined therethrough for passage of the sublimated source material to the substrate. A shutter plate is disposed above the distribution manifold and includes a plurality of passages therethrough that align with the passages in the distribution manifold in a first position of the shutter plate. The shutter plate is movable to a second position wherein the shutter plate blocks the passages in the distribution manifold to flow of sublimated material therethrough. A lifting mechanism is configured between the shutter plate and the distribution manifold to lift and move the shutter plate between the first and second positions without sliding the shutter plate on the distribution manifold.

10 Claims, 6 Drawing Sheets

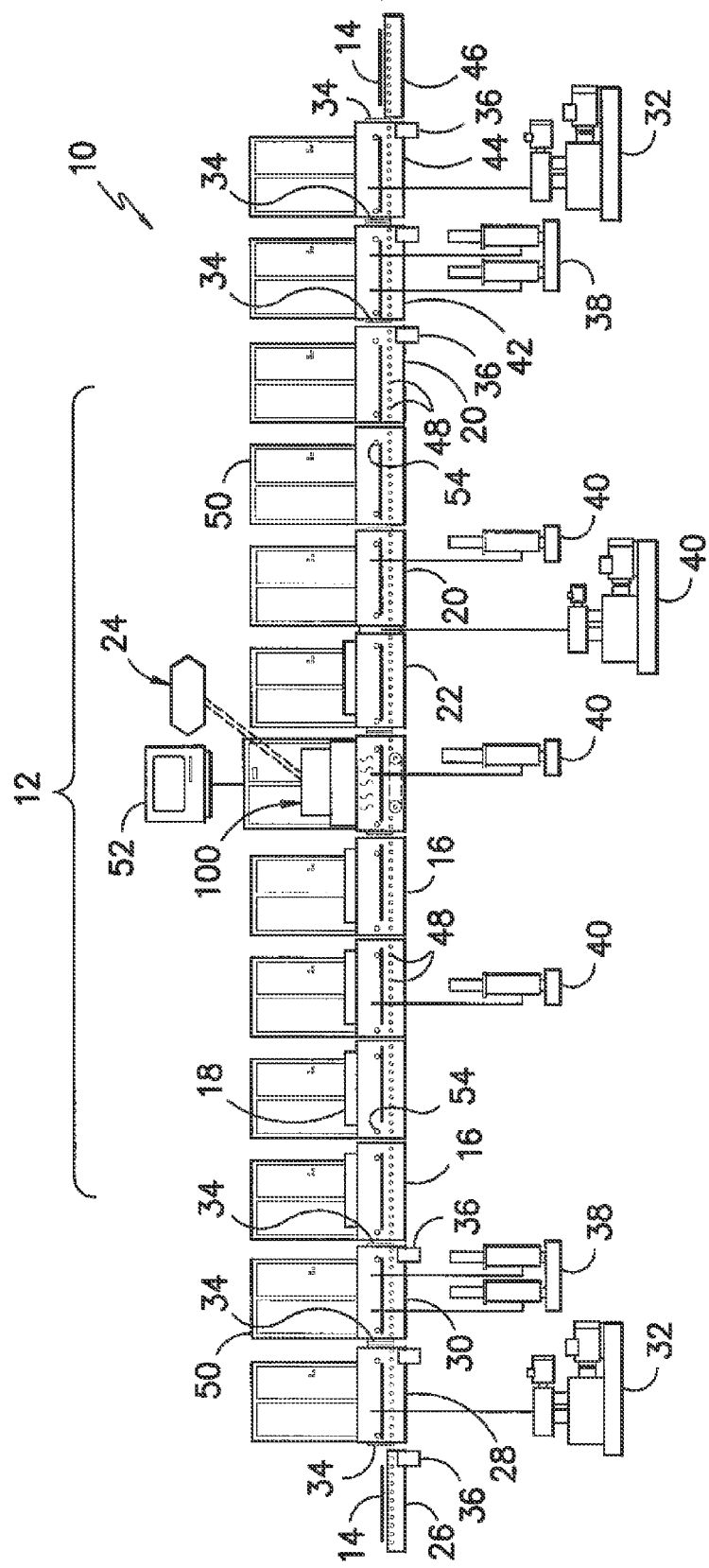
FIG. -1-

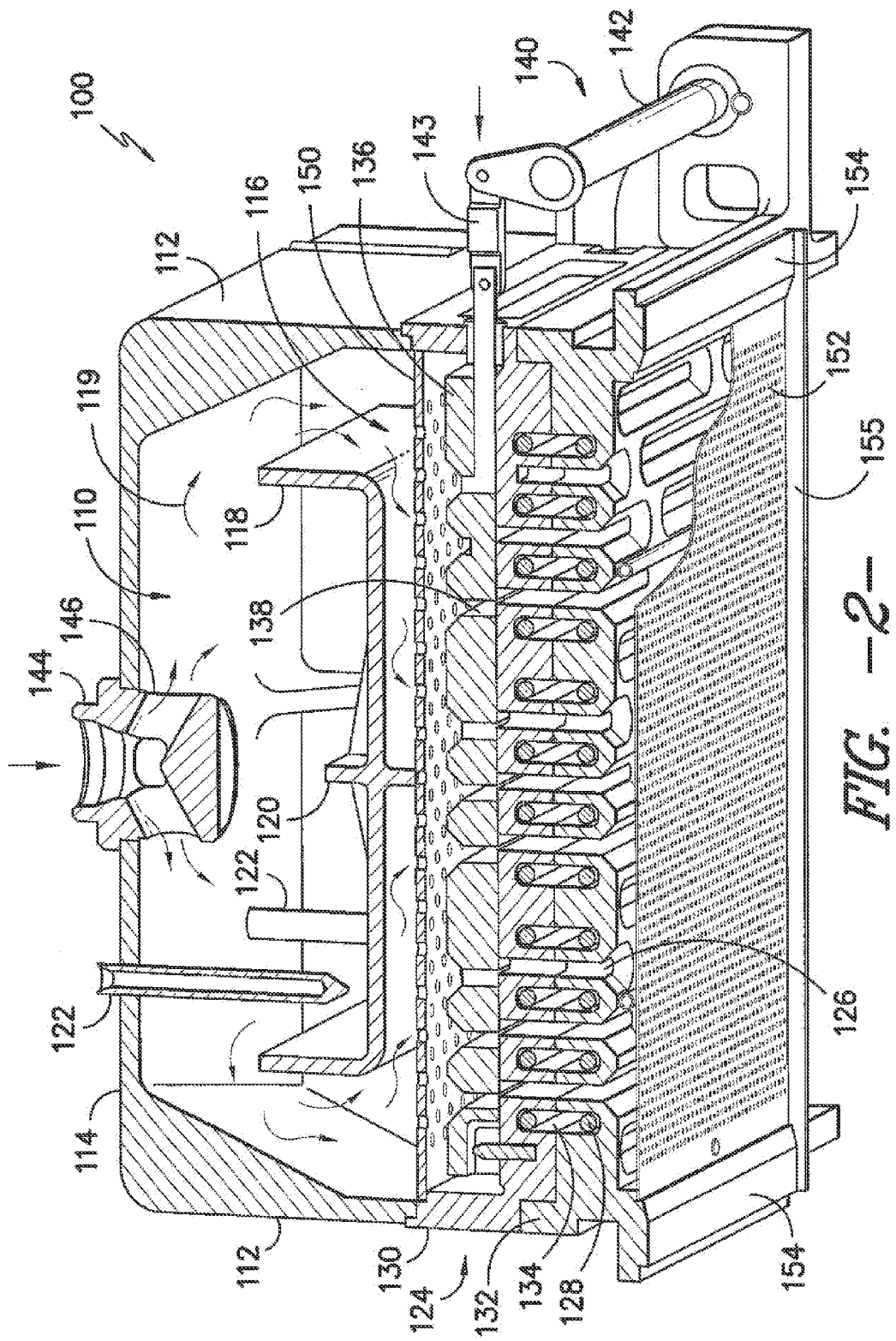
FIG. -2-

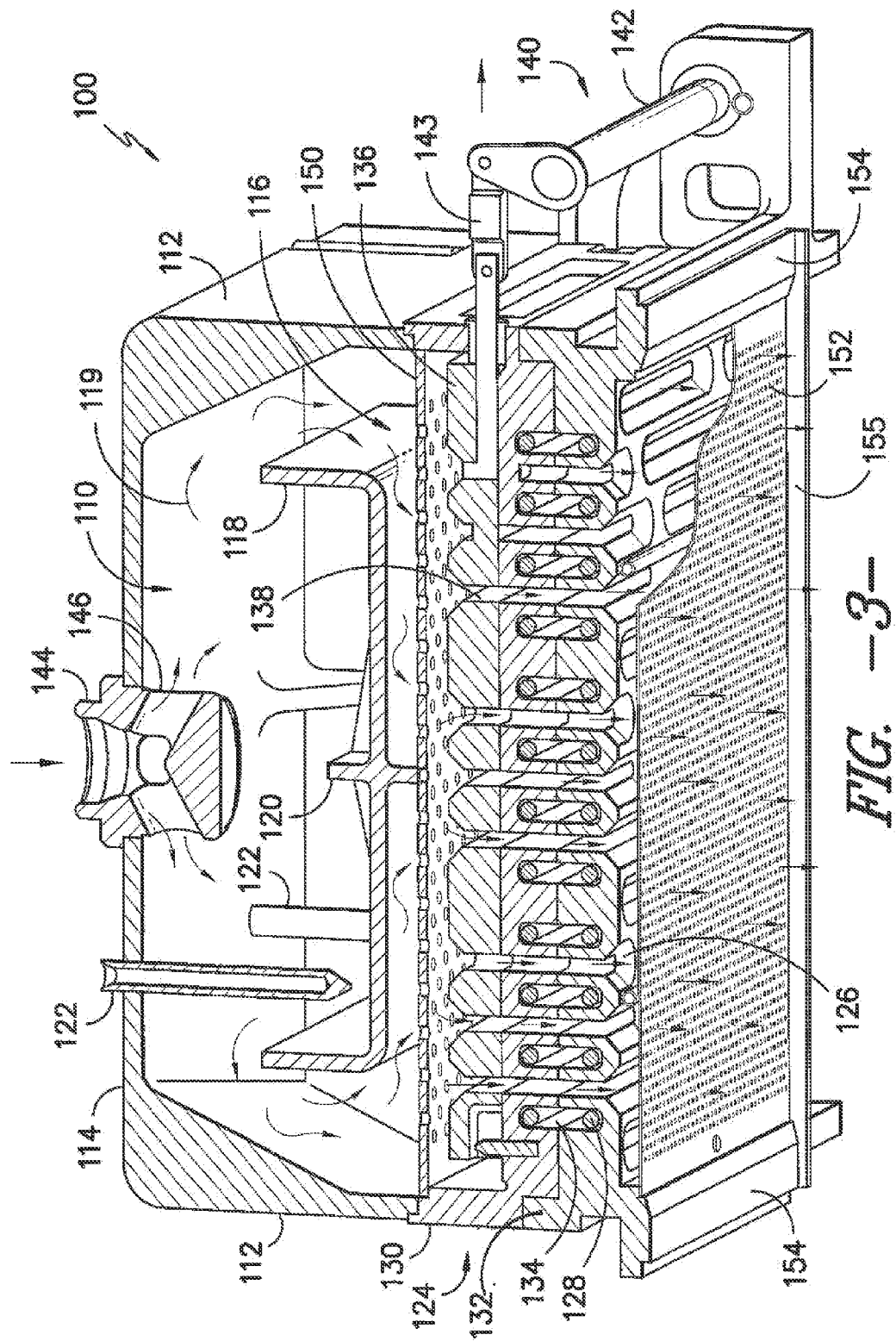
FIG. -3-

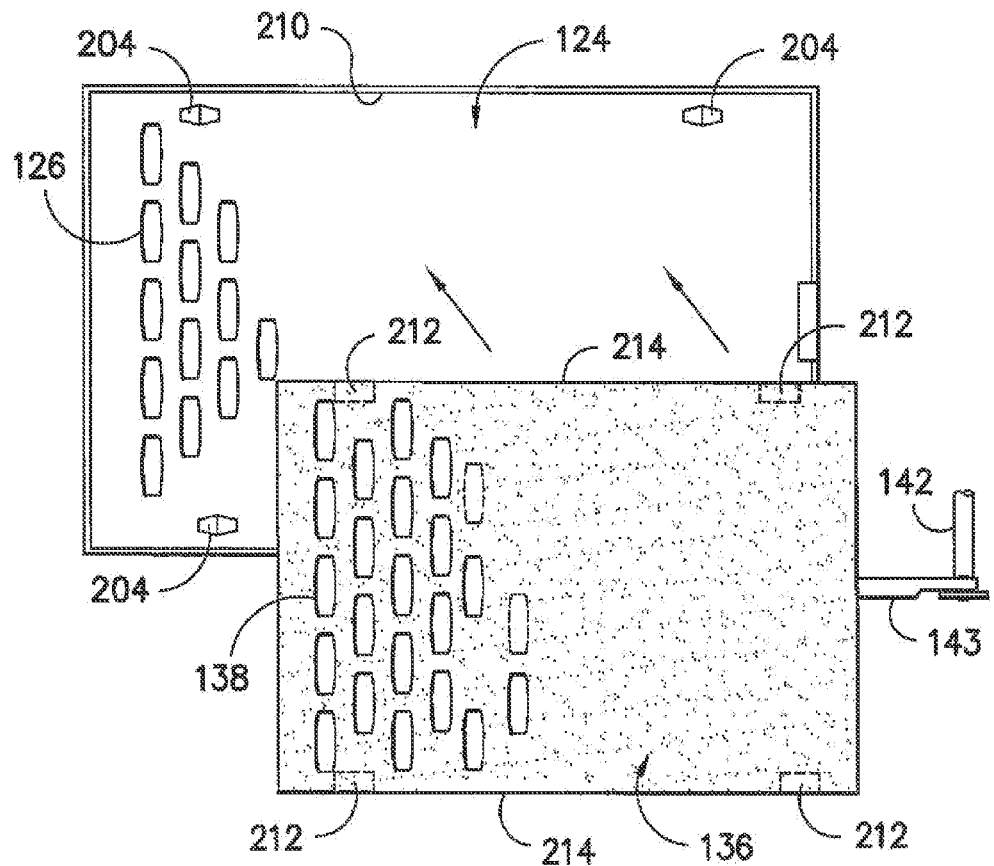
FIG. -4-
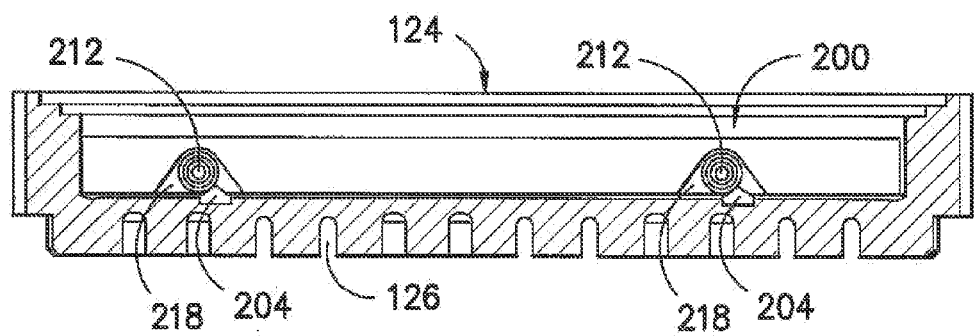
FIG. -5-

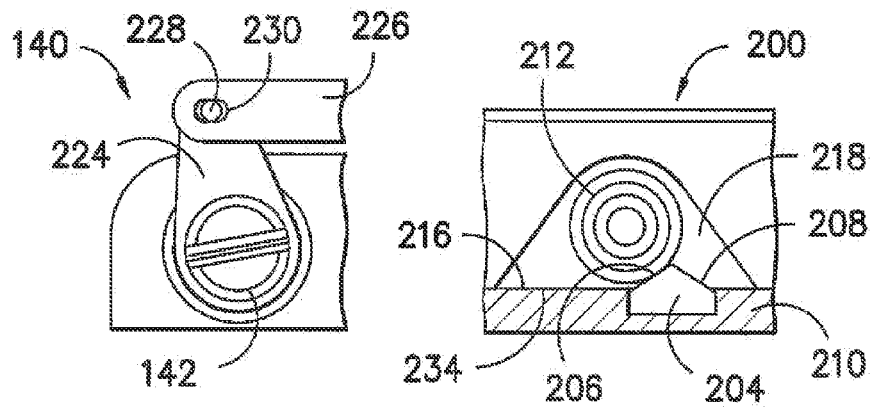
FIG. -6-
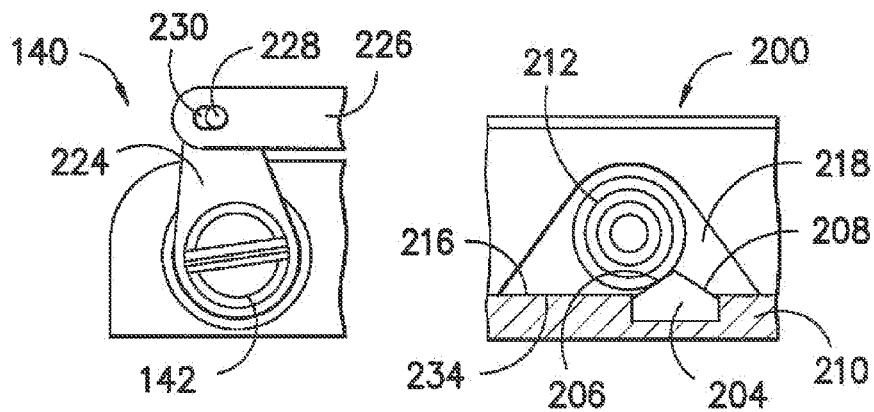
FIG. -7-
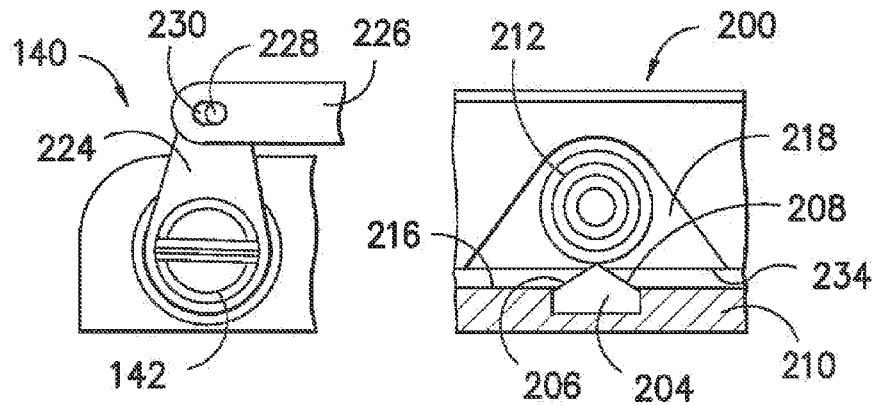
FIG. -8-

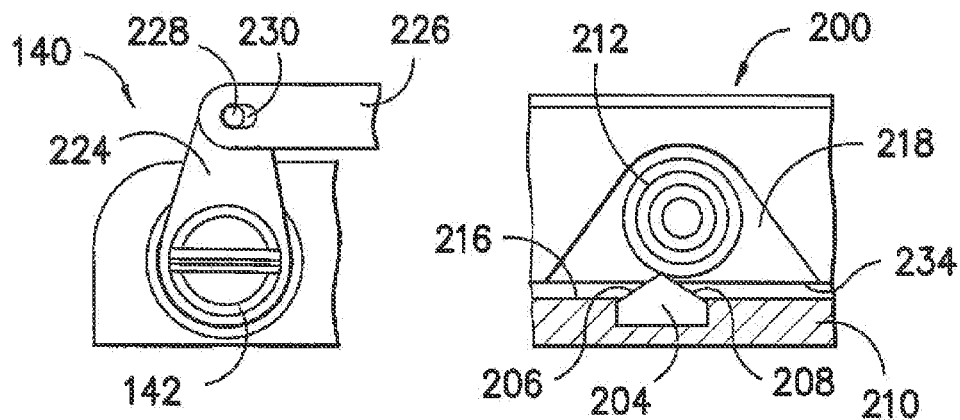
FIG. -9-
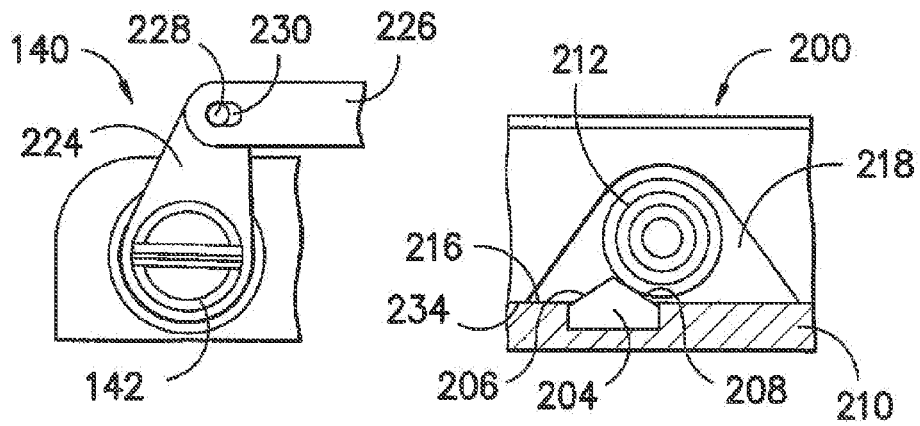
FIG. -10-
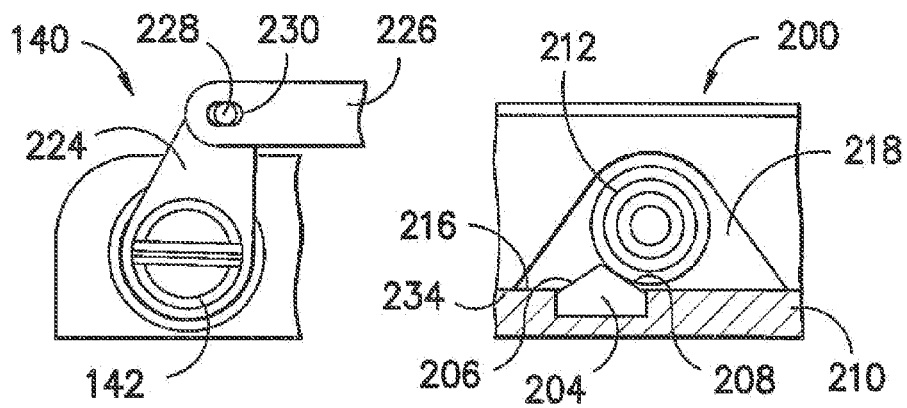
FIG. -11-

NON-WEAR SHUTTER APPARATUS FOR A VAPOR DEPOSITION APPARATUS

FIELD OF THE INVENTION

The subject matter disclosed herein relates generally to the field of thin film deposition processes wherein a thin film layer, such as a semiconductor material layer, is deposited on a substrate. More particularly, the subject matter is related to a shutter apparatus that selectively passes sublimated source material in a vapor deposition apparatus.

BACKGROUND OF THE INVENTION

Thin film photovoltaic (PV) modules (also referred to as "solar panels") are gaining wide acceptance and interest in the industry, particularly modules based on cadmium telluride (CdTe) paired with cadmium sulfide (CdS) as the photoreactive components. Solar energy systems using CdTe photovoltaic (PV) modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity. For example, CdTe is relatively expensive and, thus, efficient utilization (i.e., minimal waste) of the material is a primary cost factor. In addition, the energy conversion efficiency of the module is a factor of certain characteristics of the deposited CdTe film layer. Non-uniformity or defects in the film layer can significantly decrease the output of the module, thereby adding to the cost per unit of power. Also, the ability to process relatively large substrates on an economically sensible commercial scale is a crucial consideration.

CSS (Close Space Sublimation) is a known commercial vapor deposition process for production of CdTe modules. Reference is made, for example, to U.S. Pat. Nos. 6,444,043 and 6,423,565. Within the vapor deposition chamber in a CSS system, the substrate is brought to an opposed position at a relatively small distance (i.e., about 2-3 mm) opposite to a CdTe source. The CdTe material sublimes and deposits onto the surface of the substrate. In the CSS system of U.S. Pat. No. 6,444,043 cited above, the CdTe material is in granular form and is held in a heated receptacle within the vapor deposition chamber. The sublimated material moves through holes in a cover placed over the receptacle and deposits onto the stationary glass surface, which is held at the smallest possible distance (1-2 mm) above the cover frame. The cover is heated to a temperature greater than the receptacle.

While there are advantages to the CSS process, the related system is inherently a batch process wherein the glass substrate is indexed into a vapor deposition chamber, held in the chamber for a finite period of time in which the film layer is formed, and subsequently indexed out of the chamber. The system is more suited for batch processing of relatively small surface area substrates. The process must be periodically interrupted in order to replenish the CdTe source, which is detrimental to a large scale production process. In addition, the deposition process cannot readily be stopped and restarted in a controlled manner, resulting in significant non-utilization (i.e., waste) of the CdTe material during the indexing of the substrates into and out of the chamber, and during any steps needed to position the substrate within the chamber.

Accordingly, there exists an ongoing need in the industry for an improved vapor deposition apparatus and process for the economic large scale production of PV modules that reduces film defects and waste of the source material.

BRIEF DESCRIPTION OF THE INVENTION

Aspects and advantages of the invention will be set forth in part in the following description, or may be obvious from the description, or may be learned through practice of the invention.

In accordance with an embodiment of the invention, an apparatus is provided for vapor deposition of a sublimated source material, such as CdTe, as a thin film on a photovoltaic (PV) module substrate. Although the invention is not limited to any particular film thickness, a "thin" film layer is generally recognized in the art as less than 10 microns ($\mu$m). The apparatus includes a deposition head wherein a source material is sublimated. A distribution manifold is provided with a plurality of passages defined therethrough for passage of the sublimated source material to an underlying substrate. A shutter plate is disposed above the distribution manifold and includes a plurality of passages therethrough that align with the passages in the distribution manifold in a first position of the shutter plate. The shutter plate is movable to a second position wherein the shutter plate blocks the passages in the distribution manifold to flow of sublimated material therethrough. A lifting mechanism is configured between the shutter plate and the distribution manifold to lift and move the shutter plate between the first and second positions without sliding the shutter plate on the distribution manifold. Any manner of lifting profile may be used, including for example an arc-like path or any other non-coplanar profile.

The lifting mechanism may take on various configurations. In a particular embodiment, the lifting mechanism includes a plurality of ramps spaced along longitudinal sides of the distribution manifold, and a corresponding number of rollers spaced along longitudinal sides of the shutter plate. The rollers may be housed in recesses in the sides of the shutter plate so as not to extend radially to a bottom surface of the shutter plate. The ramps may have a lift profile such that when the rollers are located at a first side of the ramps, the shutter plate is at the first position and lies flat against the distribution manifold. When the rollers are located at a second opposite side of the ramps, the shutter plate is in the second position and lies flat against the distribution manifold. The rollers may be recessed such that they are not in contact with the distribution manifold in the first and second positions of the shutter plate.

An actuation mechanism may be connected to the shutter plate to move the shutter plate over the ramps between the first and second positions. This actuation mechanism can vary widely within the scope and spirit of the invention. In a particular embodiment, the actuation mechanism includes a driven rotatable rod and a linkage that connects the rod to the shutter plate to convert rotational motion of the rod to linear pushing or pulling motion imparted to the shutter plate. The linkage may include a drive member fixed to the rod, and an arm pivotally engaged with the drive member, for example by a pin engaged in an elongated slot. The slot may have a length such that the rollers are driven up the ramps by rotation of the rod and roll at least partially down the ramps by gravity without rotation of said rod. The slot length may further be defined such that the pin moves a limited extent within the slot when the rollers are off of the ramps in the first and second positions of the shutter plate.

In still another aspect, the invention encompasses a process for vapor deposition of a sublimated source material, such as CdTe, as a thin film on a photovoltaic (PV) module substrate. The process includes supplying source material to a deposition head and heating the source material with a heat source to sublimate the source material. The sublimated source material is directed downwardly within the deposition head through a distribution manifold and onto an upper surface of the substrates. Passages in the distribution manifold are temporarily blocked to passage of the sublimated source material through the distribution member by moving a blocking member, which may be a shutter plate, to a position on the distribution member to block passages defined through the distribution member without sliding the blocking member on the distribution member.

In a particular method embodiment, the blocking member is lifted and moved to the blocking position. This may be done, for example, by driving the blocking member up and over ramps between a first position on one side of the ramps wherein the passages in the distribution member are unblocked and a second position on the opposite side of the ramps wherein the passages in the distribution member are blocked.

These and other features, aspects, and advantages of the present invention will become better understood with reference to the following description and appended claims, or may be obvious from the description or claims, or may be learned through practice of the invention.

BRIEF DESCRIPTION OF THE DRAWING

A full and enabling disclosure of the present invention, including the best mode thereof, is set forth in the specification, which makes reference to the appended drawings, in which:

FIG. 1 is a plan view of a system that may incorporate embodiments of a vapor deposition apparatus of the present invention;

FIG. 2 is a cross-sectional view of an embodiment of a vapor deposition apparatus with a shutter plate according to aspects of the invention in a first operational configuration;

FIG. 3 is a cross-sectional view of the embodiment of FIG. 2 in a second operational configuration;

FIG. 4 is a top view of an embodiment of a distribution manifold and shutter plate in accordance with aspects of the invention;

FIG. 5 is a side cut-away view of the distribution manifold and shutter plate combination; and, FIGS. 6 through 11 are sequential operational views of the actuating mechanism and lift mechanism of the embodiment of FIG. 5 as the shutter moves from one operational position to the other.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a system 10 that may incorporate a vapor deposition apparatus 100 (FIGS. 2 and 3) in accordance with embodiments of the invention configured for deposition of a thin film layer on a photovoltaic (PV) module substrate 14 (referred to hereafter as a "substrate"). The thin film may be, for example, a film layer of cadmium telluride (CdTe). As mentioned, it is generally recognized in the art that a "thin" film layer on a PV module substrate is generally less than about 10 microns (μm). It should be appreciated that the present vapor deposition apparatus 100 is not limited to use in the system 10 illustrated in FIG. 1, but may be incorporated into any suitable processing line configured for vapor deposition of a thin film layer onto a PV module substrate 14.

For reference and an understanding of an environment in which the vapor deposition apparatus 100 incorporating a shutter plate and distribution manifold in accordance with the present invention may be used, the system 10 of FIG. 1 is described below, followed by a detailed description of the apparatus 100.

Referring to FIG. 1, the exemplary system 10 includes a vacuum chamber 12 defined by a plurality of interconnected modules. Any combination of rough and fine vacuum pumps 40 may be configured with the modules to draw and maintain a vacuum within the chamber 12. The vacuum chamber 12 includes a plurality of heater modules 16 that define a pre-heat section of the vacuum chamber through which the substrates 14 are conveyed and heated to a desired temperature before being conveyed into the vapor deposition apparatus 100. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 downstream of the vapor deposition apparatus 100. The cool-down modules 20 define a cool-down section within the vacuum chamber 12 through which the substrates 14 having the thin film of sublimated source material deposited thereon are conveyed and cooled at a controlled cool-down rate prior to the substrates 14 being removed from the system 10. Each of the modules 20 may include a forced cooling system wherein a cooling medium, such as chilled water, refrigerant, gas, or other medium, is pumped through cooling coils (not illustrated) configured with the modules 20.

In the illustrated embodiment of system 10, at least one post-heat module 22 is located immediately downstream of the vapor deposition apparatus 100 and upstream of the cool-down modules 20 in a conveyance direction of the substrates. The post-heat module 22 maintains a controlled heating profile of the substrate 14 until the entire substrate is moved out of the vapor deposition apparatus 100 to prevent damage to the substrate, such as warping or breaking caused by uncontrolled or drastic thermal stresses.

As diagrammatically illustrated in FIG. 1, a feed device 24 is configured with the vapor deposition apparatus 100 to supply source material, such as granular CdTe. The feed device 24 may take on various configurations within the scope and spirit of the invention, and functions to supply the source material without interrupting the continuous vapor deposition process within the apparatus 100 or conveyance of the substrates 14 through the apparatus 100.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to drawn an initial vacuum, and a "fine" (i.e., final) vacuum pump 38 is configured with the buffer module 30 to increase the vacuum in the buffer module 30 to essentially the vacuum pressure within the vacuum chamber 12. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12. In operation of the system 10, an operational vacuum is maintained in the vacuum chamber 12 by way of any combination of rough and/or fine vacuum pumps 40.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensors 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired conveyance rate through the vacuum chamber 12.

FIGS. 2 and 3 relate to a particular embodiment of the vapor deposition apparatus 100 that includes a deposition head 110 defining an interior space in which a receptacle 116 is configured for receipt of a granular source material (not shown), which may be supplied by a feed device or system 24 (FIG. 1) to a distributor 144 disposed in an opening in a top wall 114 of the deposition head 110. The distributor 144 includes a plurality of discharge ports 146 that are configured to evenly distribute the granular source material into the receptacle 116. The receptacle 116 has an open top and may include any configuration of internal ribs 120 or other structural elements.

In the illustrated embodiment, at least one thermocouple 122 is operationally disposed through the top wall 114 of the deposition head 110 to monitor temperature within the deposition head 110 adjacent to or in the receptacle 116.

The deposition head 110 also includes longitudinal end walls 112 and side walls (FIGS. 2 and 3) and the receptacle 116 has a shape and configuration such that the transversely extending end walls 118 of the receptacle 116 are spaced from the end walls 112 of the head chamber 110. The longitudinally extending side walls of the receptacle 116 lie adjacent to and in close proximation to the side walls of the deposition head 110 so that very little clearance exists between the respective side walls. With this configuration, sublimated source material will primarily flow out of the open top of the receptacle 116 and downwardly over the transverse end walls 118 as leading and trailing curtains of vapor 119 over, as depicted by the flow lines in FIGS. 2 and 3. The curtains of vapor 119 are "transversely" oriented in that they extend across the transverse dimension of the deposition head 110, which is generally perpendicular to the conveyance direction of the substrates through the system.

A heated distribution manifold 124 is disposed below the receptacle 116. This distribution manifold 124 may take on various configurations within the scope and spirit of the invention, and may serve to indirectly heat the receptacle 116, as well as to distribute the sublimated source material that flows from the receptacle 116. In the illustrated embodiment, the heated distribution manifold 124 has a clam-shell configuration that includes an upper shell member 130 and a lower shell member 132. Each of the shell members 130, 132 includes recesses therein that define cavities 134 when the shell members are mated together as depicted in FIGS. 2 and 3. Heater elements 128 are disposed within the cavities 134 and serve to heat the distribution manifold 124 to a degree sufficient for indirectly heating the source material within the receptacle 116 to cause sublimation of the source material. The heat generated by the distribution manifold 124 is also sufficient to prevent the sublimated source material from plating out onto components of the head chamber 110.

Still referring to FIGS. 2 and 3, the heated distribution manifold 124 includes a plurality of passages 126 defined therethrough. These passages have a shape and configuration so as to uniformly distribute the sublimated source material towards an underlying substrate through a distribution plate 152 disposed below the distribution manifold 124.

A debris shield 150 may be disposed between the receptacle 116 and the distribution manifold 124. This shield 150 includes holes defined therethrough (which may be larger or smaller than the size of the holes of the distribution plate 152) and primarily serves to retain any granular or particulate source material from passing through and potentially interfering with operation of the movable components of the shutter plate 136.

Referring to FIGS. 2 and 3, apparatus 100 may include longitudinal seals 155 and transversely extending seals 154 at each longitudinal end of the head chamber 110. In the illustrated embodiment, the seals 154 define an entry slot and an exit slot at the longitudinal ends of the head chamber 110 and are disposed at a distance above the upper surface of the substrates that is less than the distance between the surface of the substrates 14 and the distribution plate 152 and help to maintain the sublimated source material in the deposition area above the substrates.

Referring to FIGS. 2 and 3, the illustrated embodiment includes a movable shutter plate 136 disposed above the distribution manifold 124. This shutter plate 136 includes a plurality of passages 138 defined therethrough that align with the passages 126 in the distribution manifold 124 in a first operational position of the shutter plate 136 as depicted in FIG. 3 wherein the sublimated source material is free to flow through the shutter plate 136 and through the passages 126 in the distribution manifold 124 for subsequent distribution through the plate 152. Referring to FIG. 2, the shutter plate 136 is movable to a second operational position relative to the upper surface of the distribution manifold 124 wherein the passages 138 in the shutter plate 136 are misaligned with the passages 126 in the distribution manifold 124. In this configuration, the sublimated source material is blocked from passing through the distribution manifold 124, and is essentially contained within the interior volume of the head chamber 110.

The movable shutter plate 136 is particularly beneficial in that the sublimated source material can be quickly and easily contained within the head chamber 110 and prevented from passing through to the deposition area above the conveying unit. This may be desired, for example, during start up of the system 10 while the concentration of vapors within the head chamber builds to a sufficient degree to start the deposition process. Likewise, during shutdown of the system, it may be desired to maintain the sublimated source material within the head chamber 110 to prevent the material from condensing on the conveyor or other components of the apparatus 100.

Referring to FIGS. 4 through 11, a lifting mechanism 200 is provided for moving the shutter plate 136 between its operational positions wherein it covers (blocks) and uncovers (unblocks) the passages 126 in the distribution manifold 124 without sliding the shutter plate 136 along the upper surface 216 of the manifold 124. It is desired to prevent sliding movement between the shutter plate 136 and manifold 124 for various reasons. For example, sliding movement between the components can result in frictional wear, as well as the generation of particulates that could fall through the passages 126 in the distribution manifold 124 and result in defects in the film layer formed on the underlying substrates. In addition, sliding relative motion between the shutter plate 136 and upper surface 216 of the distribution manifold 124 may also result in binding or sticking between the components, and thus a loss of control over the shutter plate 136. In addition, for various reasons, it may be desired that the shutter plate 136 and distribution manifold 124 are provided with a protective outer layer, such as graphite with a silicon carbide coating. Sliding frictional movement between the components will eventually wear away this coating and result in loss of protection of the coating.

Referring again to FIGS. 4 through 11, the lifting mechanism 200 is configured between the shutter plate 136 and the upper surface 216 of the distribution manifold 124 to lift and move the shutter plate 136 between its first and second operational positions in an arc-like path without causing sliding relative movement of the components against each other.

The lifting mechanism 200 may take on various configurations. In the illustrated embodiment, the lifting mechanism 200 includes a plurality of ramps 204 that are spaced along opposite longitudinal sides 210 of the distribution manifold 124, as particularly illustrated in FIGS. 4 and 5. Each of the ramps 204 includes a first ramp side 206 and an oppositely inclined second ramp side 208.

A corresponding number of rollers 212 are provided along the longitudinal sides 214 of the shutter plate 136. The rollers 212 may be rotationally supported within recesses 218 defined in the longitudinal sides 214, as particularly illustrated in FIGS. 5 through 11. The rollers 212 are disposed within the recesses 218 at a height so that the rollers 204 do not contact the upper surface 216 of the distribution manifold 124 on either side of the ramp 204. In other words, when the shutter plate 136 is in either of its operational positions, the bottom surface 234 of the shutter plate 136 rests (by gravity) on the upper surface 216 of the underlying distribution manifold 124 without the rollers 212 being in contact with the distribution manifold.

The ramps 204 have a lift profile such that when the rollers 212 are located at the first side 206 of the ramp, the shutter plate 136 is at the first operational position and lies flat against the distribution manifold. In this position, however, the rollers 212 are in contact against the first side 206 of the ramp such that linear motion imparted to the shutter plate 136 causes the rollers 212 to immediately roll up the first side 206 of the ramps 204. When the rollers 212 are located at the opposite side 208 of the ramps 204 (as depicted in FIG. 11), the shutter plate 136 is in its second operational position and again lies flat against the upper surface 216 of the distribution manifold 124.

An actuation mechanism 140 is connected to the shutter plate 136 to move the shutter plate over the ramps 204 between the first operational position (depicted in FIG. 6) and the second operational position (depicted in FIG. 11). The actuation mechanism 140 may vary widely within the scope and spirit of the invention. In the illustrated embodiment, the actuation mechanism 140 includes a driven rotatable rod 142 and a linkage 143 that connects the rod 142 to the shutter plate 136. The linkage 143 serves to convert rotational motion of the rod 142 to linear pushing or pulling motion (depending on the rotational direction of the rod 142) imparted to the shutter plate 136.

It should be appreciated that the linkage 143 may include any manner of operationally connected elements. In the depicted embodiment, the linkage 143 includes a drive member 224 that is fixed to the rod 142. An arm 226 is pivotally engaged with the drive member 224, for example by a pin 228 that extends into an elongated slot 230 defined in the arm 226, as particularly illustrated in FIGS. 6 through 11. The opposite end of the arm 226 is connected to the shutter plate 136.

Referring to FIG. 6, the slot 230 defined in the arm 226 may have an elongated longitudinal length such that, in the first operational position of the shutter plate 136 depicted in FIG. 6 and the second operational position of the shutter plate 136 depicted in FIG. 11, the pin 228 floats within the slot 230 without engaging either end of the slot 230. With this configuration, an initial degree of rotation of the rod 142 and drive member 224 is needed to engage the pin 228 against the end of the slot 230 before motion is imparted to the shutter plate 136, as depicted in FIG. 7.

FIG. 8 depicts further rotation of the rod 142 and drive member 224 after the pin 228 has engaged the slot 230, which causes linear motion to be imparted to the shutter plate 136. This motion causes the rollers 212 to ride up the first side 206 of the ramps 204 until the rollers 212 reach the peak of the ramps 204 as depicted in FIG. 8. At this position, the shutter plate 136 is lifted above the upper surface 216 of the distribution manifold by an amount 220 corresponding to the height of the ramps 204. Referring to FIG. 9, slight further rotation of the rod 142 causes the rollers 212 to roll down the second side 208 of the ramps 204 by the force of gravity, which results in the arm 226 shifting relative to the pin 228 until the pin 228 engages against the opposite side of the slot 230, as depicted in FIGS. 9 and 10.

Further rotation of the rod 142 and drive member 224 as depicted in FIGS. 10 and 11 drives the pin 228 into the free-floating position within the slot 230 as depicted in FIG. 11 without further movement of the rollers 212 relative to the ramp 204.

FIG. 11 depicts the configuration wherein the shutter plate 136 is at its second operational position with the rollers 212 at the second side 208 of the ramps 204. The rollers 212 are engaged on the ramp without touching the upper surface 216 of the distribution manifold 124 and are in position for a reverse sequence of the steps depicted in FIGS. 6 through 11 to move the shutter plate 136 back to its first operational position.

It should thus be appreciated from the sequence of events depicted in FIGS. 6 through 11 that the shutter plate 136 is lifted up off of the upper surface 216 of the distribution manifold, moved in an arc-like path in this lifted position from the first operational position to the second operational position, and then lowered back down onto the upper surface 216 of the distribution manifold without any relative sliding motion between the components. The slot 230 in the arm 226 provides several degrees of rotational tolerance of the rod 142 at both operational positions of the shutter plate 136. Thus, rotational control of the rod 142 and linkage 143 can accommodate for the reality that the rod 142 may not stop in the exact same rotational position for each operating sequence of the shutter plate 136.

As mentioned, the present invention also encompasses various method embodiments for vapor deposition of a sublimated source material as a thin film on a substrate. The process includes supplying source material to a deposition head 110 and heating the source material with a heat source to sublimate the source material. The sublimated source material is then directed downwardly within the deposition head 110 through a distribution manifold 124 and onto an upper surface of a substrate conveyed under the distribution manifold 124. Passages 126 in the distribution manifold are temporarily blocked to passage of the sublimated source material through the distribution manifold 124 by lifting and moving a blocking member, which may be, for example, a shutter plate 136 as discussed above. The blocking member is lifted and moved relative to the distribution manifold 124, for example in an arc-like path, to block the passages 126 in the manifold without sliding the blocking member along the distribution manifold 124.

In a particular embodiment, the method for lifting and moving the blocking member includes driving the blocking member up and over ramps 204 on the distribution manifold 124 between a first operational position on one side of the ramps 204 and a second operational position on the opposite side of the ramps 204 wherein the passages 126 in the distribution manifold are blocked.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An apparatus for vapor deposition of a sublimated source material as a thin film on a photovoltaic (PV) module substrate, said apparatus comprising:
    a deposition head wherein a source material is sublimated;
    a distribution manifold comprising a plurality of passages defined therethrough for passage of the sublimated source material to a substrate;
    a shutter plate disposed above said distribution manifold, said shutter plate comprising a plurality of passages therethrough that align with said passages in said distribution manifold in a first position of said shutter plate in direct contact with said distribution manifold, said shutter plate movable to a second position in direct contact with said distribution manifold wherein said shutter plate blocks said passages in said distribution manifold to flow of sublimated material therethrough; and
    a lifting mechanism configured relative to said shutter plate and said distribution manifold to lift and move said shutter plate between said first and second positions without sliding said shutter plate on said distribution manifold.

2. The apparatus as in claim 1, wherein said lifting mechanism comprises a plurality of ramps spaced along longitudinal sides of said distribution manifold, and a corresponding number of rollers spaced along longitudinal sides of said shutter plate.

3. The apparatus as in claim 2, wherein said ramps have a lift profile such that when said rollers are located at a first side of said ramps, said shutter plate is at said first position, and when said rollers are located at a second side of said ramps, said shutter plate is in said second position.

4. The apparatus as in claim 3, wherein said rollers are disposed in respective recesses in said longitudinal sides of said shutter plate such that said shutter plate lies flat against said distribution manifold in said first and second positions with said rollers out of contact with said distribution manifold.

5. The apparatus as in claim 2, further comprising an actuation mechanism connected to said shutter plate to move said shutter plate over said ramps between said first and second positions.

6. The apparatus as in claim 5, wherein said actuation mechanism comprises a rotatable rod and a linkage that connects said rod to said shutter plate to convert rotational motion of said rod to linear pushing or pulling motion imparted to said shutter plate.

7. The apparatus as in claim 6, wherein said linkage comprises a drive member fixed to said rod, and an arm pivotally engaged with said drive member by a pin engaged in an elongated slot, said slot comprising a length such that said rollers are driven up said ramps by rotation of said rod and roll at least partially down said ramps by gravity without rotation of said rod.

8. The apparatus as in claim 7, wherein said slot length is defined such that said pin moves a limited extent within said slot when said rollers are off of said ramps in said first or second positions of said shutter plate.

9. The apparatus as in claim 1, wherein said distribution manifold comprises internal heating elements arranged between said passages in said manifold.

10. The apparatus as in claim 9, wherein said distribution manifold comprises an upper shell member and a lower shell member, said shell members defining internal cavities in which said heating elements are disposed.

* * * * *